United States Patent
Drynan

[11] Patent Number: 6,001,734
[45] Date of Patent: *Dec. 14, 1999

[54] FORMATION METHOD OF CONTACT/THROUGH HOLE

[75] Inventor: John Mark Drynan, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/933,396

[22] Filed: Sep. 19, 1997

[30] Foreign Application Priority Data

Sep. 20, 1996 [JP] Japan ................... 8-250390

[51] Int. Cl.$^6$ ............................ H01L 21/4763
[52] U.S. Cl. .................. 438/637; 438/639; 438/945; 438/950
[58] Field of Search .................. 438/637, 639, 438/945, 950

[56] References Cited

U.S. PATENT DOCUMENTS

| | | | |
|---|---|---|---|
| 4,390,394 | 6/1983 | Mathuni et al. | 156/643 |
| 4,977,105 | 12/1990 | Okamoto et al. | 438/639 |
| 5,034,347 | 7/1991 | Kakihana | 438/945 |
| 5,091,339 | 2/1992 | Carey | 438/945 |
| 5,262,352 | 11/1993 | Woo et al. | 437/189 |
| 5,330,934 | 7/1994 | Shibata et al. | 438/639 |
| 5,382,544 | 11/1995 | Matsumoto et al. | 438/945 |
| 5,444,021 | 8/1995 | Chung et al. | 437/195 |
| 5,466,637 | 11/1995 | Kim | 438/639 |
| 5,468,342 | 11/1995 | Nulty et al. | 438/945 |
| 5,529,956 | 6/1996 | Morishita | 438/639 |
| 5,565,372 | 10/1996 | Kim | 437/52 |
| 5,641,695 | 6/1997 | Moore et al. | 438/945 |
| 5,658,830 | 8/1997 | Jeng | 438/639 |
| 5,686,354 | 11/1997 | Avanzino et al. | 437/190 |
| 5,741,741 | 4/1998 | Tseng | 438/637 |
| 5,795,823 | 8/1998 | Avanzino et al. | 438/639 |
| 5,846,873 | 12/1998 | Violette et al. | 438/585 |
| 5,861,344 | 1/1999 | Roberts et al. | 438/738 |
| 5,874,359 | 2/1999 | Liaw et al. | 438/640 |

FOREIGN PATENT DOCUMENTS

| | | |
|---|---|---|
| 1-264239 | 10/1989 | Japan . |
| 3-248429 | 11/1991 | Japan . |
| 5-13593 | 1/1993 | Japan . |
| 6-53334 | 2/1994 | Japan . |
| 6-310606 | 11/1994 | Japan . |
| 7-94490 | 4/1995 | Japan . |

OTHER PUBLICATIONS

H. Shibata et al., "A Novel Zero–Overlap/Enclosure Metal Interconnection Technology For High Density Logic VLSI'S" VMIC Conference, Jun. 12–13, 1990, pp. 15–21.

*Primary Examiner*—John F. Niebling
*Assistant Examiner*—Lynne A. Gurley
*Attorney, Agent, or Firm*—Sughrue, Mion, Zinn, Macpeak & Seas, PLLC

[57] ABSTRACT

A formation method of a contact/through hole is provided, which is able to form a contact or through hole without raising such problems related to a resist mask. After forming a dielectric layer on a semiconductor substructure having a lower electrical conductor, a metal layer is formed on the dielectric layer. A patterned resist film is formed on the metal layer. Then, the metal layer is selectively etched using a patterned resist film as a mask to transfer the pattern of the resist film to the metal layer, forming a hole pattern to penetrate the metal layer. The patterned resist film is removed from the etched metal layer. The dielectric layer is selectively etched using the etched metal layer as a mask to thereby transfer the hole pattern of the metal layer to the dielectric layer. Thus, a contact/through hole is formed to penetrate the dielectric layer and to extend to the lower electrical conductor. The metal layer serves as a mask having a sufficient etch selectivity for the dielectric layer during the etching step. The metal layer is subject to negligible thickness reduction with respect to its initial thickness due to an etching action.

8 Claims, 13 Drawing Sheets

FORMATION METHOD OF CONTACT/THROUGH HOLE

BACKGROUND OF THE INVENTION

1. Field of the Invention

The present invention relates to a formation method of a contact/through hole and more particularly, to a formation method of a contact hole or a through hole for electrically interconnecting an upper electrical conductor with a lower electrical conductor through a dielectric layer intervening between the upper and lower conductors, which is applicable to fabrication of an Ultra-Large-Scale Integrated circuit (ULSI).

2. Description of the Prior Art

Various patterning processes for electrically-conductive or dielectric layers are performed in a ULSI fabrication sequence.

With a typical patterning process of this sort, a wanted Pattern of geometrical shapes is formed in a resist film using a lithography technique. Then, unnecessary materials are selectively removed by an etching process using the resist film with the pattern as a mask. This mask serves to protest an underlying layer or layers with respect to the mask during this etching process.

In a formation process of a contact or through hole penetrating an interlayer dielectric layer to electrically interconnect an upper electrical conductors with a lower electrical conductor, two known masking techniques may be utilized.

A first one of the masking techniques utilizes a patterned photoresist film as a mask. A second one of the masking techniques utilizes a hard mask layer made of an inorganic material such as polycrystalline silicon (i.e., polysilicon).

When a contact or through hole is formed to penetrate an interlayer dielectric layer using the first masking technique, it is sufficient to pattern the photoresist film by a lithography technique, forming a window or hole pattern penetrating through the photoresist film. The patterned photoresist film thus obtained serves as a mask during a subsequent etching process, in which a penetrating hole serving as the contact or through hole is formed in the interlayer dielectric layer at a corresponding location to the window of the photoresist film.

To maintain the critical dimension control of the pattern on the photoresist film within a specific range, an etchant for this etching process needs to have a sufficient etch selectivity between the photoresist film and the interlayer dielectric layer so that the thickness of the photoresist film is kept approximately unchanged even after completion of this etching process.

Subsequently, the patterned photoresist film is removed by contacting this photoresist film with an oxygen ($O_2$) plasma that incinerates the photoresist film and/or a solvent in which the photoresist film is soluble.

Further, the contact or through hole formed in the interlayer dielectric layer is filled with an electrically-conductive material, resulting in an electrically-conductive plug that electrically interconnects an upper electrical conductor with a lower electrical conductor.

When a contact or through hole is formed in an interlayer dielectric layer using the second masking technique, first, the photoresist film is patterned by a photolithography technique, forming a window or hole pattern penetrating through the photoresist film. Next, the pattern of the photoresist film thus formed is transferred to an underlying hard mask layer (i.e., a first hard mask layer) by an etching process, forming a hole penetrating the hard mask layer at a location corresponding to the window of the photolithography film. The patterned photoresist film is then removed.

At this stage, if it is determined that the transferred hole onto the first hard mask layer is excessively large, a thin mask layer (i.e., a second hard-mask layer), which is made of the same material as that of the first hard mask layer, is formed on the first hard mask layer to have the same contour as that of the transferred hole. The second hard mask layer thus formed is then removed during a subsequent anisotropic dry etching process.

During this anisotropic dry etching process, although the second hard mask layer is removed from the horizontal surfaces such as the hole bottom of the hard mask layer and the hole top thereof, it is left unchanged from the vertical surfaces such as the hole sidewall of the hard mask layer. As a result, the initial size of the hole of the first hard mask layer is reduced by approximately twice the thickness of the second hard mask layer.

The second mask layer serves as a mask during a subsequent etching process, in which a penetrating hole serving as the contact or through hole is formed in the interlayer dielectric layer at a corresponding location to the hole of the second hard mask layer.

To maintain the critical dimension control of the pattern on the second hard mask layer within a specific range, an etchant for this etching process needs to have a sufficient etch selectivity between the second hard mask layer and the interlayer dielectric layer so that the thickness of the second hard mask layer is kept approximately unchanged even after this etching process.

A most-popular hard mask layer for contact-hole formation is made of polysilicon having a comparatively-high etching resistance during a reactive-ion etching (RIE) process for silicon dioxide ($SiO_2$). In this case, after an etching process for a contact hole is completed, a polysilicon hard mask layer is left on the surface of a semiconductor wafer. In addition to using polysilicon in the polysilicon hard mask layer, a polysilicon plug layer is commonly used for plugging a contact hole formed in a $SiO_2$ layer.

To further miniaturize each of the semiconductor devices and elements on the ULSI, for the upper electrical conductor a conductive layer or layers with an electrical resistance lower than the polysilicon hard mask and plug layers must be used. Hence, after depositing the polysilicon layer to form the plug, both the polysilicon hard mask layer and the polysilicon plug layer must be isotropically etched to either reduce their combined thickness or completely remove them from the wafer surface leaving the polysilicon in the contact hole intact. Since both layers are polysilicon, the etching process is simple. The lower-resistance electrically conductive layer is then deposited on top of the plug. As a result, the polysilicon-plugged contact hole is formed to penetrate through the $SiO_2$ layer in such a way that the underlying $SiO_2$ layer is exposed in the vicinity of the top end of the polysilicon-plugged contact hole.

A first typical example of the conventional formation methods of a contact hole using a polysilicon hard mask is shown in FIGS. 1A to 1H.

First, as shown in FIG. 1A, an impurity-doped region 202 is formed in a surface area of a silicon (Si) substrate 201. Next, an interlayer dielectric layer 203 of $SiO_2$ is formed on the substrate 201 to cover the impurity-doped region 202. A hard mask layer 204 of polysilicon is formed on the interlayer dielectric layer 203.

A patterned photoresist film 205 is formed on the hard mask layer 204. This photoresist film 205 has a window or contact-hole pattern 205A formed by a photolithography technique. The state at this stage is shown in FIG. 1A.

The hard mask layer 204 is selectively etched by an RIE process using the patterned photoresist film 205 as a mask, forming a hole pattern 206 penetrating the hard mask layer 204. The photoresist film 205 is then removed. Thus, the contact-hole pattern 205A of the photoresist film 205 is transferred to the hard mask layer 204, as shown in FIG. 1B.

Subsequently, the interlayer dielectric layer 203 is selectively etched by an RIE process using the polysilicon hard mask layer 204 as a mask, forming a contact hole 207 penetrating the dielectric layer 203, as shown in FIG. 1C. The contact hole 207 exposes the underlying impurity-doped region 202.

A polysilicon layer 208 for an electrically-conductive plug is formed on the hard mask layer 204 to bury the contact hole 207 by a Low-Pressure Chemical Vapor Deposition (LPCVD) process. The contact hole 207 is filled with the polysilicon of the layer 208, as shown in FIG. 1D.

The polysilicon plug layer 208 and the polysilicon hard-mask layer 204 are removed by an isotropic RIE process, resulting in a polysilicon plug 209 in the contact hole 207, as shown in FIG. 1E. The contact hole 207 is fully filled with the plug 209.

An electrically-conductive layer 210 is deposited on the $SiO_2$ interlayer dielectric layer 203 and the polysilicon plug 209, as shown in FIG. 1F. A patterned resist film 211 is formed on this layer 210 by a lithography technique, as shown in FIG. 1G.

Using the patterned resist film 211 as a mask, the electrically-conductive layer 210 is selectively etched by an RIE process, transferring the pattern of the resist film 211 to the electrically-conductive layer 210. Thus, an upper electrical conductor 212 is formed on the interlayer dielectric layer 203 and the plug 209, as shown in FIG. 1H. The upper electrical conductor 212 is contacted with the polysilicon plug 209 and is electrically connected to the impurity-doped region 202 in the substrate 201 through the plug 209.

A second typical example of the conventional formation methods of a contact hole using a polysilicon hard mask is shown in FIGS. 2A to 2H.

First, as shown in FIG. 2A, an impurity-doped region 202 is formed in a surface area of a silicon substrate 201. Next, an interlayer dielectric layer 203 of $SiO_2$ is formed on the substrate 201 to cover the impurity-doped region 202. A hard mask layer 204 of polysilicon is formed on the interlayer dielectric layer 203.

A patterned photoresist film 205 is formed on the hard mask layer 204. This photoresist film 205 has a window or contact-hole pattern 205A formed by a photolithography technique. The state at this stage is shown in FIG. 2A.

The hard mask layer 204 is selectively etched by an RIE process using the patterned photoresist film 205 as a mask, forming a hole pattern 206 penetrating the hard mask layer 204. The photoresist film 205 is then removed. Thus, the contact-hole pattern 205A of the photoresist film 205 is transferred onto the hard mask layer 204, as shown in FIG. 2B.

The above processes are the same as those in the first conventional method shown in FIGS. 1A to 1H.

Subsequently, unlike the first conventional method, a thin polysilicon layer 227 is deposited on the patterned polysilicon hard-mask layer 204, as shown in FIG. 2C. The thin polysilicon layer 227 is contacted with the interlayer dielectric layer 203 in the hole pattern 206.

The thin polysilicon layer 206 is then etched by an anisotropic RIE process to be selectively left on the side face of the hard mask layer 204 in the hole pattern 206. Thus, a polysilicon sidewall 228 is formed in the hole pattern 206 of the hard mask layer 204, as shown in FIG. 2D. Thus, the size of the hole pattern 206 is reduced by the sidewall 22B by approximately twice the thickness of the sidewall 228.

The interlayer dielectric layer 203 is selectively etched by an RIE process using the polysilicon hard-mask layer 204 and the polysilicon sidewall 228 as a mask, forming a contact hole 229 penetrating the dielectric layer 203, as shown in FIG. 2D. The contact hole 229 exposes the underlying impurity-doped region 202.

A polysilicon layer 208 for a plug is formed on the hard mask layer 204 to bury the contact hole 229 thus formed by a LPCVD process. The contact hole 229 is filled with the polysilicon of the layer 208, as shown in FIG. 2E.

The polysilicon plug layer 208, the polysilicon hard-mask layer 204, and the polysilicon sidewall 228 are removed by an isotropic RIE process, resulting in a polysilicon plug 229 in the contact hole 229, as shown in FIG. 2F. The contact hole 229 is fully filled with the plug 209.

An electrically-conductive layer 210 is deposited on the $SiO_2$ interlayer dielectric layer 203 and the polysilicon plug 209, as shown in FIG. 2F. A patterned resist film 211 is formed on this layer 210 by a lithography technique, as shown in FIG. 2G.

Using the patterned resist film 211 as a mask, the electrically-conductive layer 210 is selectively etched by an RIE process, transferring the pattern of the resist film 211 onto the electrically-conductive layer 210. Thus, an upper electrical conductor 212 is formed on the interlayer dielectric layer 203 and the plug 209, as shown in FIG. 2H. The upper electrical conductor 212 is contacted with the polysilicon plug 209 and is electrically connected to the impurity-doped region 202 in the substrate 201 through the plug 209.

The above-described first and second conventional methods using the polysilicon hard mask layer are sufficient for the present ULSIs. However, for the future ULSIs that will be further miniaturized, these methods have the following problems.

A first problem is that the conventional hard-mask technique is unable to be applied to the contact or through holes in the future ULSIs. The reason is as follows.

When each semiconductor device or element on the ULSI is further miniaturized to increase the number of the chips per wafer, each contact or through hole penetrating an interlayer dielectric layer will be further miniaturized. Consequently, the ratio of depth to width (i.e., the aspect ratio) of the hole will become larger. On the other hand, the aspect ratio of a corresponding hole pattern of a resist mask will not become large, because the resist mask needs to be thinner with the decreasing size of the semiconductor devices or elements. The thinner resist mask has a lower etching resistance.

To form the deep contact or through hole in the interlayer dielectric layer using the resist mask, an etching period of time is required to be set as longer. However, in this case, the resist mask is entirely etched away before the hole is completely etched in the interlayer dielectric layer because of the reduced etching resistance of the resist mask.

Accordingly, the above-described conventional hard-mask techniques have a limit for the further-miniaturized future ULSIs.

A second problem is that the conventional hard-mask techniques are readily applicable to only the case where the subsequent plugging method of a contact or through hole using a polysilicon plug includes deposition and etching processes of polysilicon. The conventional hard-mask techniques are not applicable to the future ULSIs with a minimum feature size of a quarter (¼) μm, because an impurity-doped polysilicon plug filled into a hole with a large aspect ratio does not have a sufficient low electric resistance. Therefore, a metal plug needs to be filled into the hole instead of the polysilicon plug.

In this case, however, the polysilicon hard mask is unable to be s electively removed without etching the exposed silicon substrate at the bottom of the contact hole prior to deposition of a metal for the plug. On the other hand, if the polysilicon hard mask is left intact until deposition of the metal layer for the plug, and then removed during etching of the metal to form the upper electrical conductor, the required etching to remove the metal and polysilicon layers will become more complicated.

Further, the deposition temperature of polysilicon produced by a LPCVD process is typically 500 to 700° C. An electrically-conductive layer located under the interlayer dielectric layer has an insufficient heat resistance against the high temperature of 500 to 700° C. For example, an aluminum alloy will melt at a temperature ranging from 500 to 700° C. Therefore, the polysilicon hard mask is unable to be used to form a through hole in the interlayer dielectric layer.

To solve the above first and second problems, silicon nitride ($Si_3N_4$) may be used as the hard mask layer instead of polysilicon. Alternately, $Si_3N_4$ may be used as an etch stop layer located on the $SiO_2$ interlayer dielectric layer to utilize a high etch selectivity between $Si_3N_4$ and $SiO_2$. However, in this case, there arises another problem that the leakage current through a transistor junction increases because of a high stress of $Si_3N_4$.

There arises a further problem that $Si_3N_4$ is unable to be used as a hard mask for a through hole because of a comparatively high deposition temperature of $Si_3N_4$.

SUMMARY OF THE INVENTION

Accordingly, an object of the present invention is to provide a formation method of a contact/through hole that is able to form both of a contact/through hole without raising such problems as those related to a resist mask.

Another object of the present invention is to provide a formation method of a contact/through hole that is capable of reducing the process temperature.

Still another object of the present invention is to provide a formation method of a contact/through hole that is applicable to the future ULSIs with a minimum feature size of a quarter μm.

The above objects together with others not specifically mentioned will become clear to those skilled in the art from the following description.

A formation method of a contact/through hole according to a first aspect of the present invention is comprised of the following steps (a) to (f):
(a) A dielectric layer is formed on a semiconductor substructure having a lower electrical conductor.
(b) A metal layer is formed on the dielectric layer.
(c) A patterned resist film is formed on the metal layer. The resist film has a pattern for a contact/through hole.
(d) The metal layer is selectively etched using the patterned resist film as a mask to thereby transfer the pattern of the resist film to the metal layer. Thus, a hole pattern is formed to penetrate the metal layer.
(e) The patterned resist film is removed from the etched metal layer.
(f) The dielectric layer is selectively etched using the etched metal layer as a mask to thereby transfer the hole pattern of the metal layer to the dielectric layer. Thus, a contact/through hole is formed to penetrate the dielectric layer and to extend to the lower electrical conductor.

The metal layer serves as a mask having a sufficient etch selectivity for the dielectric layer during the step (f). The contact/through hole is completed while the metal layer is subject to negligible thickness reduction with respect to its initial thickness due to an etching action during the step (f).

With the formation method of a contact/through hole according to the first aspect of the present invention, the pattern of the resist film for the contact/through hole is transferred to the metal layer, and then, the metal layer thus pattern-transferred is used as a hard mask during the etching step (f) for the dielectric layer.

The metal layer has a higher etching resistance to an etching action during the step (f) compared with the conventional resist film. Also, unlike the conventional resist film, the pattern contour of the metal layer does not tend to degrade even if the metal layer is subjected to the etching action and high temperature during the step (f).

Accordingly, any one of contact and through holes is able to be formed without raising such problems as those related to a resist mask.

Further, the metal layer may be formed by a Physical Vapor Deposition (PVD) process such as sputtering or evaporation or by any one of the various CVD processes. Therefore, compared with the first and second conventional methods described previously in which a polysilicon mask is used, any one of contact and through holes is able to be formed at decreased process temperatures.

As a result, this method is applicable to the future ULSIs with a minimum feature size of a quarter μm.

In the method according to the first aspect, the dielectric layer may be made of any dielectric material such as $SiO_x$ and $SiN_x$. The metal layer may be made of any metal such as W, Ti, and TiN. The resist film may be made of a film of any resist material such as photoresist, Electron-Beam (EB) resist, and so on.

Each of the etching steps (d) and (f) may be performed by any one of the dry and wet etching processes.

In a preferred embodiment of the method according to the first aspect, a step (g) of removing the metal layer is provided after the step (f), and a step (h) of forming an electrically-conductive plug to fill the hole of the dielectric layer is provided after the step (g). The lower electrical conductor in the substructure is electrically connected to an upper electrical conductor formed on the dielectric layer through the plug.

It is preferred that the step (g) of removing the metal layer is performed by a wet etching process using an etchant having a good etch selectivity with respect to the dielectric layer and the exposed substructure.

In another preferred embodiment of the method according to the first aspect, a step (g) of forming an electrically-conductive plug to fill the hole of the dielectric layer without removing the metal layer is provided. The lower electrical conductor in the substructure is electrically connected to an upper electrical conductor formed on the dielectric layer through the plug. The remaining metal layer serves as a part of the upper electrical conductor.

A formation method of a contact/through hole according to a second aspect of the present invention is comprised of the following steps (a) to (h):

(a) A dielectric layer is formed on a semiconductor substructure having a lower electrical conductor.

(b) A first metal layer is formed on the dielectric layer.

(c) A patterned resist film is formed on the first metal layer. The resist film has a pattern for a contact/through hole.

(d) The first metal layer is selectively etched using the patterned resist film as a mask to thereby transfer the pattern of the resist film to the first metal layer. Thus, a hole pattern is formed to penetrate the first metal layer.

(e) The patterned resist film is removed from the etched, first metal layer.

(f) A second metal layer is formed on the etched, first metal layer. The second metal layer is contacted with the dielectric layer in the hole pattern of the first metal layer.

(g) The second metal layer is selectively etched by an anisotropic etching process, forming a metal sidewall by the remaining the second metal layer in the hole pattern of the first metal layer.

(h) The dielectric layer is selectively etched using a combination of the etched first metal layer and the metal sidewall as a mask to thereby transfer the hole pattern of the metal sidewall to the dielectric layer. Thus, a contact/through hole is formed to penetrate the dielectric layer and to extend to the lower electrical conductor.

The combination of the first metal layer and the metal sidewall serve as a mask having a sufficient etch selectivity for the dielectric layer during the etching step (h). The contact/through hole is completed while the first metal layer and the metal sidewall are subject to negligible thickness reduction with respect to their initial thickness due to an etching action during the etching step (h).

With the formation method of a contact/through hole according to the second aspect of the present invention, the pattern of the resist film for the contact/through hole is transferred to the first metal layer. Also, the metal sidewall is formed by the second metal layer to narrow the transferred pattern of the first metal layer. Then, the combination of the first metal layer thus pattern-transferred and the metal sidewall is used as a hard mask during the etching process (f) for the dielectric layer.

Each of the first metal layer and the metal sidewall has a higher etching resistance to an etching action during the etching process (f) compared a conventional resist film. Also, unlike a conventional resist film, the pattern contours of the first metal layer and the metal sidewall do not tend to degrade even if the first metal layer and the metal sidewall are subjected to the etching action and high temperature during the etching process (f).

Accordingly, any one of contact and through holes is able to be formed without raising such problems as those related to a resist mask.

Further, each of the first and second metal layers may be formed by any one of the PVD and CVD processes. Therefore, compared with the first and second conventional methods described previously in which a polysilicon mask is used, any one of contact and through holes is able to be formed at decreased process temperatures.

As a result, this method is applicable to the future ULSIs with a minimum feature size of a quarter $\mu$m.

In the method according to the second aspect, the dielectric layer may be made of any dielectric material such as $SiO_x$ and $SiN_x$. Each of the first and second metal layers may be made of any metal such as W, Ti, and TiN. The resist film may be made of a film of any resist material such as photoresist, Electron-Seam (EB) resist, and so on.

Each of the etching steps (g) and (h) may be performed by any one of the dry and wet etching processes.

In a preferred embodiment of the method according to the second aspect, a step (i) of removing the first metal layer and the metal sidewall is provided after the step (h), and a step (j) of forming an electrically-conductive plug to fill the hole of the dielectric layer is provided after the step (i). The lower electrical conductor in the substructure is electrically connected to an upper electrical conductor formed on the dielectric layer through the plug.

It is preferred that the step (i) of removing the first metal layer and the metal sidewall is performed by a wet etching process using an etchant having a good etch selectivity with respect to the dielectric layer and the exposed substructure.

In another preferred embodiment of the method according to the first aspect, a step (j) of forming an electrically-conductive plug to fill the hole of the dielectric layer without removing the first metal layer and the metal sidewall is provided. The lower electrical conductor in the substructure is electrically connected to an upper electrical conductor formed on the dielectric layer through the plug. The remaining metal layer serves as a part of the upper electrical conductor.

In the formation methods according to the first and second aspects of the present invention, the semiconductor substructure may be optionally configured as necessary. However, the semiconductor substructure is typically formed by either a semiconductor substrate having an electrically-conductive region, or an electrically-conductive layer formed over a semiconductor substrate through at least one electrically-insulating layer.

In this specification, a "contact hole" is defined as a hole penetrating a dielectric layer, which is used for electrically interconnecting a lower electrical conductor formed in a semiconductor substrate (e.g., a diffusion region in a semiconductor substrate) with an upper electrical conductor such as a patterned, electrically-conductive layer through the hole. A "through hole" is defined as a hole penetrating a dielectric layer, which is used for electrically interconnecting a lower electrical conductor formed over a semiconductor substrate (e.g., a patterned, electrically-conductive layer) with an upper electrical conductor such as a patterned, electrically-conductive layer through the hole.

BRIEF DESCRIPTION OF THE DRAWINGS

In order that the invention may be readily carried into effect, it will now be described with reference to the accompanying drawings.

FIGS. 5A to 5I are partial cross-sectional views showing a formation method of a contact hole according to a third embodiment of the present invention, respectively.

DETAILED DESCRIPTION OF THE PREFERRED EMBODIMENTS

Preferred embodiments of the present invention will be described below with reference to the drawings attached.

FIRST EMBODIMENT

A formation method of a contact hole according to a first embodiment is shown in FIGS. 3A to 3G.

Figure 1A:
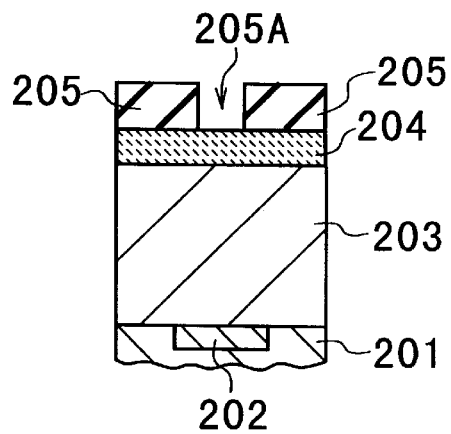
FIGS. 1A to 1H are partial cross-sectional views showing a conventional formation method of a contact hole using a polysilicon hard mask and a polysilicon plug, respectively.
Figure 1B:
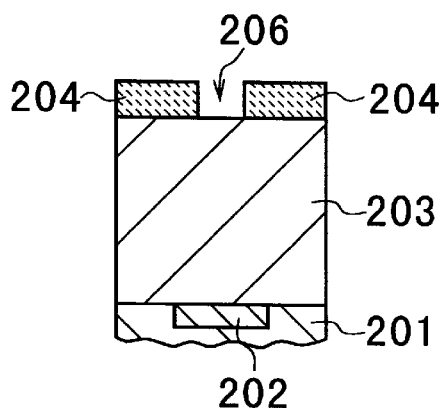
Figure 1C:
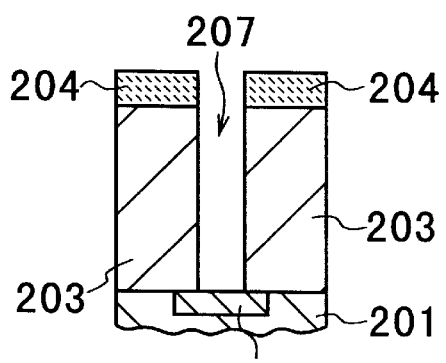
Figure 1D:
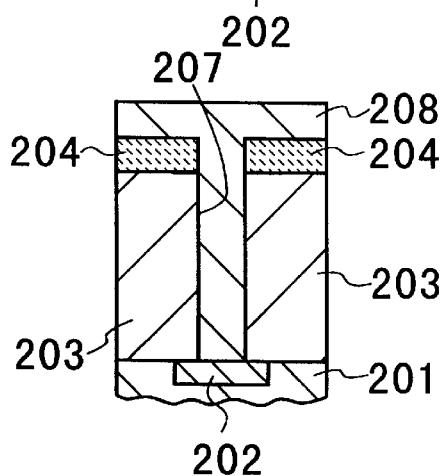
Figure 1E:
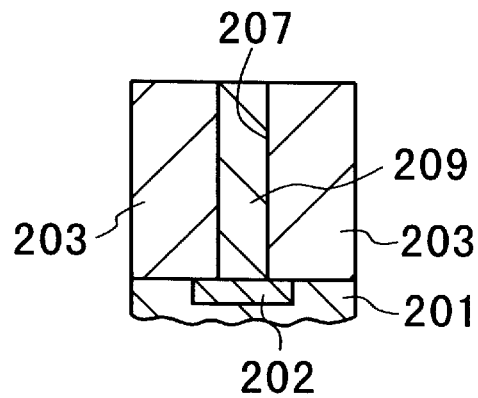
Figure 1F:
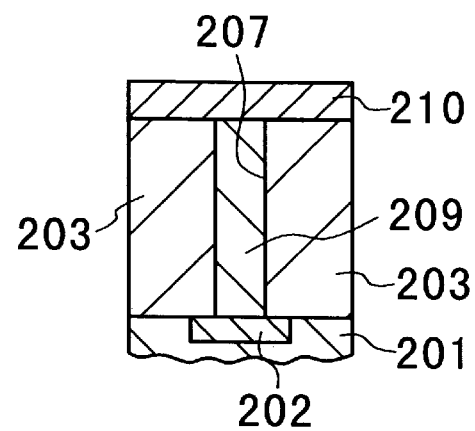
Figure 1G:
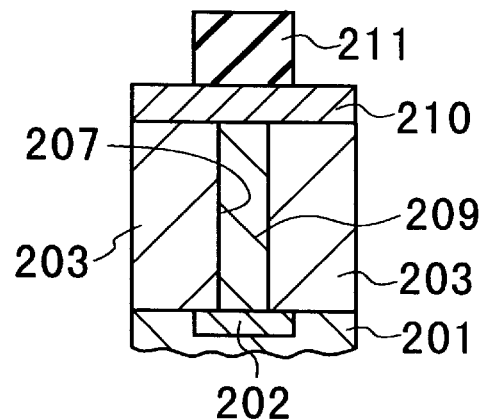
Figure 1H:
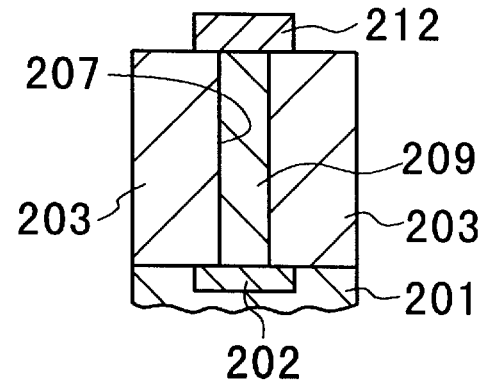
Figure 2A:
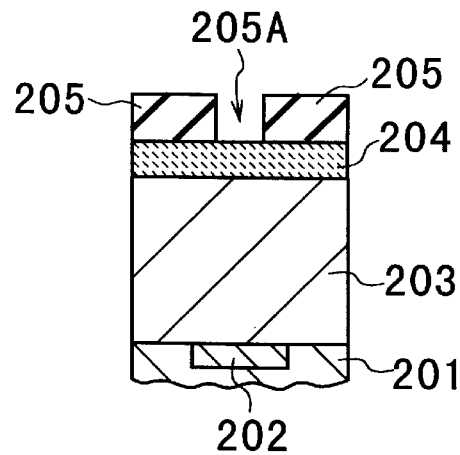
FIGS. 2A to 2H are partial cross-sectional views showing another conventional formation method of a contact hole using a polysilicon hard mask and a polysilicon plug, respectively.
Figure 2B:
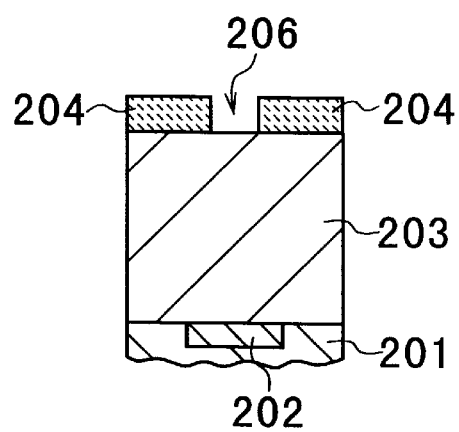
Figure 2C:
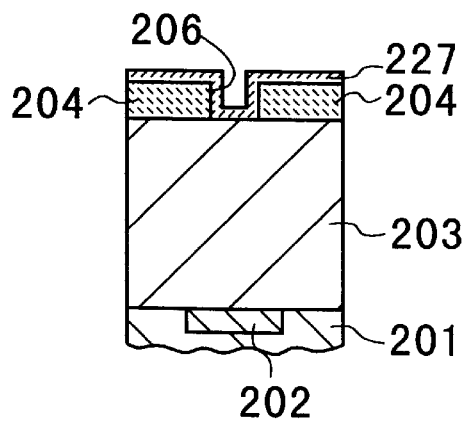
Figure 2D:
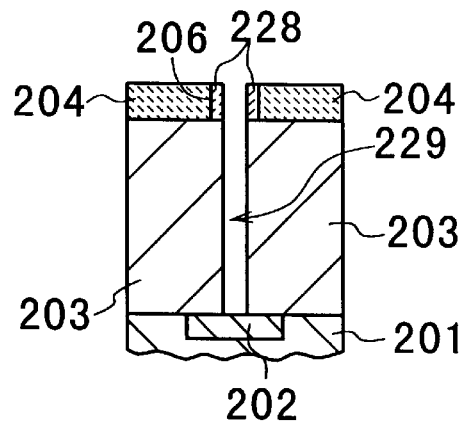
Figure 2E:
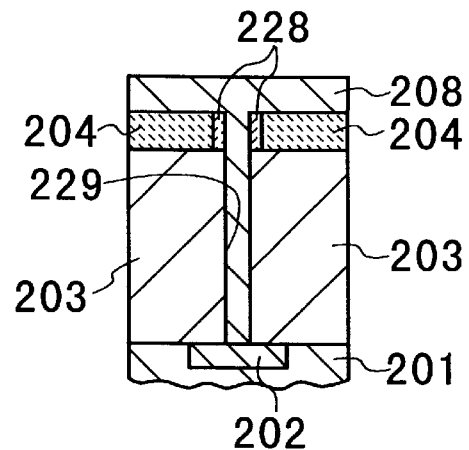
Figure 2F:
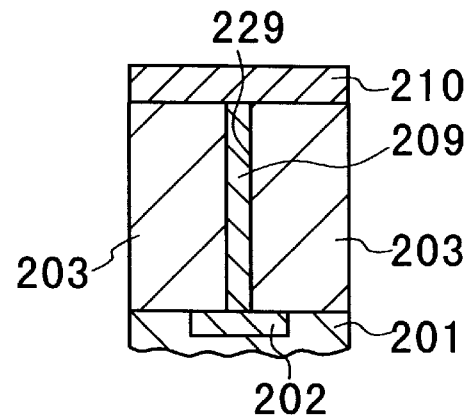
Figure 2G:
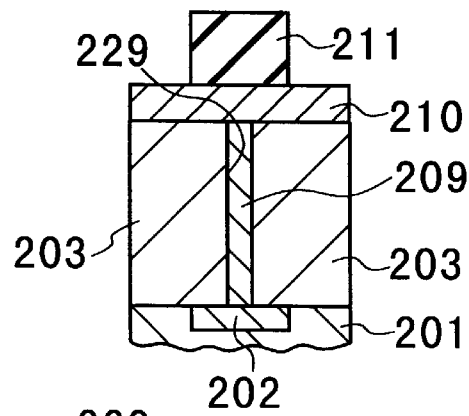
Figure 2H:
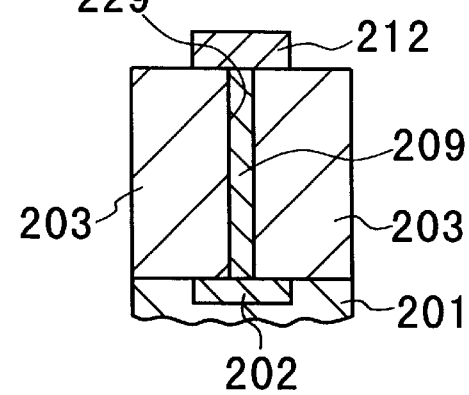
Figure 3A:
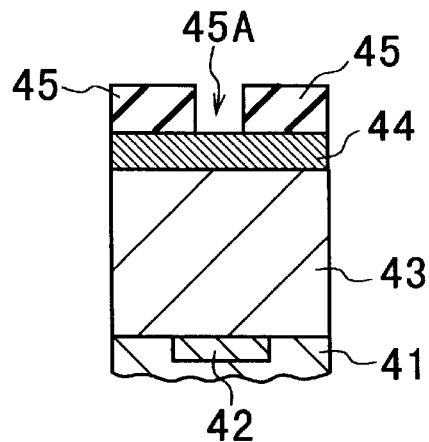
FIGS. 3A to 3G are partial cross-sectional views showing a formation method of a contact hole according to a first embodiment of the present invention, respectively.

First, as shown in FIG. 3A, an n-type impurity such as arsenic (As) or phosphorus (P) is selectively diffused into the surface region of a p-type single-crystal silicon substrate 41, forming an n-type impurity-doped region 42 in the substrate 41. This n-type impurity-doped region 42 serves as a lower electrical conductor.

Second, an $SiO_2$ layer 43 with a thickness of 1 µm is deposited on the substrate 41 to cover the n-type impurity-doped region 42 by a CVD process. This $SiO_2$ layer 43 serves as an interlayer dielectric layer.

A tungsten (W) layer 44 with a thickness of 100 nm is deposited on the $SiO_2$ layer 43 by a sputtering process. This W layer 44 is contacted with the $SiO_2$ layer 43 with no intervening layer or structure such as a well-known, two-layered structure formed by an upper titanium nitride (TiN) sublayer and a lower titanium (Ti) sublayer. This is because the following reason.

If a W layer is deposited directly on a $SiO_2$ layer by a CVD process, which is termed a "CVD-W" layer, this CVD-W layer tends to flake from the $SiO_2$ layer. It has been known that this tendency is able to be prevented from occurring by intervening a two-layered structure of an upper TiN layer and a lower Ti layer between the W and $SiO_2$ layers. In this structure, the lower Ti layer serves as a contact layer for improving an adhesion property to the $SiO_2$ layer. The upper TiN layer serves as a barrier layer for preventing the chemical reaction of the Ti layer with a tungsten fluoride ($WF_6$) gas serving as a CVD reaction gas during a W CVD process.

On the other hand, if a W layer is deposited directly on a $SiO_2$ layer by a Physical Vapor Deposition (PVD) process such as sputtering or evaporation, which is termed a "PVD-W" layer, this PVD-W layer does not have a tendency to flake from the $SiO_2$ layer. This is because the PVD-W layer has a good adhesion property to the $SiO_2$ layer.

Following the sputtering process of the W layer 44, a patterned electron-beam (EB) resist film 45 with a thickness of 500 nm is formed on the W layer 44 thus deposited by an EB lithography technique. This resist film 45 has a window or a hole pattern 45A with a rectangular plan shape of 200 nm in width. The state at this stage is shown in FIG. 3A.

Figure 3B:
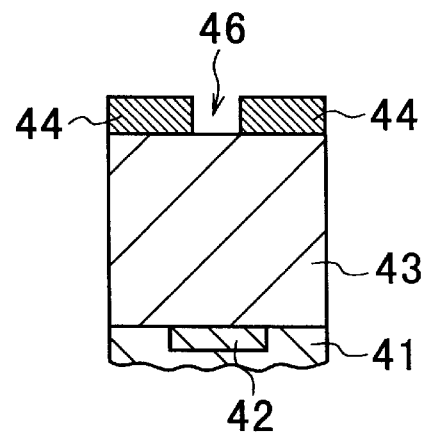

Subsequently, using the patterned EB resist film 45 as a mask, the W layer 44 is selectively etched by an RIE process, forming a penetrating hole 46 in the W layer 44, as shown in FIG. 3B. Thus, the hole pattern 45A of the resist film 45 is transferred to the W layer 44. The $SiO_2$ layer 43 is exposed from the W layer 44 in the hole 46. The EB resist film 45 is then removed by using oxygen ($O_2$) plasma or another popular process.

Figure 3C:
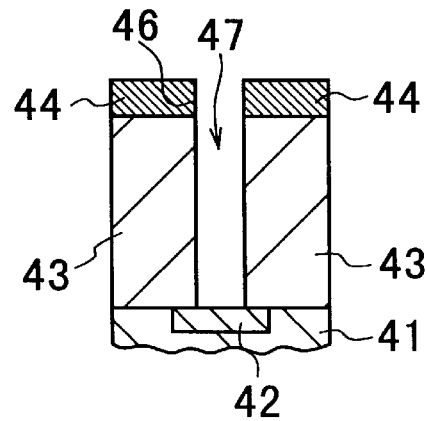

The RIE process for the W layer 44 is, for example, carried out under the following condition:

Gas Pressure: 8 mTorr,
Applied RF Power: 40 W
Reaction Gas: $BCl_3/SF_6/N_2$
Gas Flow Rate: 30/50/5 sccm The $SiO_2$ layer 43 is selectively etched by an RIE process using the patterned W layer 44 as a hard mask, forming a contact hole 47 penetrating through the $SiO_2$ layer 43, as shown in FIG. 3C. The contact hole 47 is located just over the n-type impurity-doped region 42. The region 42 is exposed from the $SiO_2$ layer 43 through the contact hole 47.

Figure 3D:
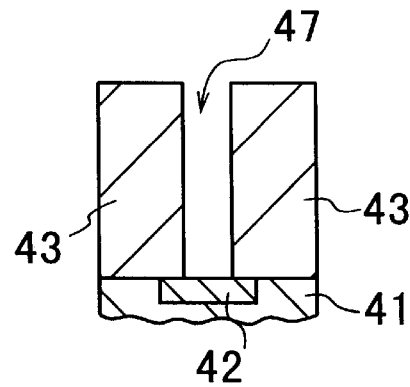

The RIE process for the $SiO_2$ layer 44 is, for example, carried out under the following condition:

Gas Pressure: 30 mTorr,
Applied RF Power: 700 W
Reaction Gas: $C_4F_8$/CO/Ar
Gas Flow Rate: 10/140/60 sccm The W layer 44, which has been used as the hard mask, is removed from the $SiO_2$ layer 43 by dipping the layer 44 into a hydrogen peroxide ($H_2O_2$) at room temperature for two minutes. The state at this stage is shown in FIG. 3D.

Figure 3E:
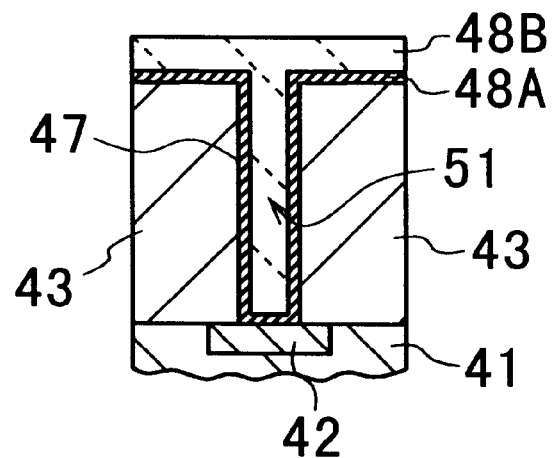

A Ti layer 48A with a thickness of 30 nm and a TiN layer 48B with a thickness of 100 nm are successively deposited on the $SiO_2$ layer 43 by CVD processes to cover the contact hole 47, as shown in FIG. 3E. If the contact hole 47 has a size of approximately 0.25 µm or less, the hole 47 may be completely filled with the Ti and TiN layers 48A and 48B and thus, an additional CVD-W layer is not included in this embodiment. In this case, the lower Ti layer 48A serves as a contact layer improving the adhesion property of the upper TiN layer 48B to the $SiO_2$ layer 43. The upper TiN layer 48B serves as the main conductive layer of the upper electrical conductor 50 and electrically conductive plug 51.

As seen from FIG. 3E, within the contact hole 47, the lower Ti layer 48A is contacted with not only the inner side face of the $SiO_2$ layer 43 but also the n-type impurity-doped region 42 in the substrate 41.

Figure 3F:
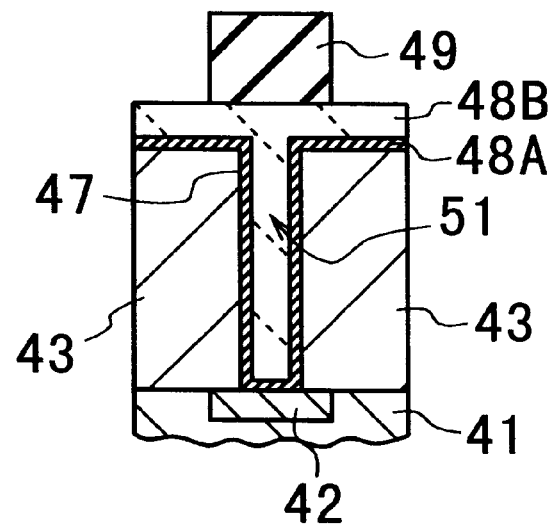

Subsequently, a patterned EB resist film 49 is formed on the TiN layer 48B, as shown in FIG. 3F. The resist film 49 has a pattern with a width of 240 nm, which correspond to an upper conductor 50.

Figure 3G:
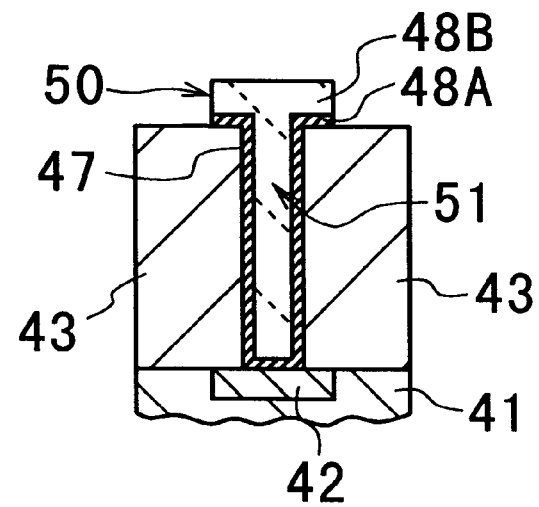

Using the patterned EB resist film 49 as a mask, the underlying Ti and TiN layers 48A and 48B are selectively etched by an RIE process, as shown in FIG. 3G. Thus, the layers 48A and 48B are selectively left in the area surrounding the upper opening end of the contact hole 47. This area corresponds to the resist film 49.

The RIE processes for the Ti/TiN layers 48A and 48B are, for example, carried out under the following condition:

Gas Pressure: 8 mTorr,
Applied RF Power: 75 W
Reaction Gas: $BCl_3/Cl_2$
Gas Flow Rate: 30/70 sccm The upper parts of the remaining Ti and TiN layers 48A and 48B serve as an upper electrical conductor 50. The lower parts of the remaining Ti and TiN layers 48A and 48B in the contact hole 47 serve as an electrically-conductive plug 51. The upper electrical conductor 50 is electrically interconnected with the n-type impurity-doped region 42 in the substrate 41 through the metal plug 51.

With the formation method of a contact hole according to the first embodiment, the pattern 45A of the EB resist film 45 for the contact hole 47 is transferred to the W layer 44 and then, the W layer 44 thus pattern-transferred is used as a hard mask during the RIE process for the $SiO_2$ layer 43.

The W layer 44 has a higher etching resistance to an etching action during the RIE process for the $SiO_2$ layer 43 compared a conventional resist film. Also, unlike a conventional resist film, the pattern contour of the patterned W layer 44 does not tend to degrade even if the W layer 44 is subjected to the etching action and high temperature during the etching process.

Accordingly, the contact hole 47 is able to be formed without raising such problems as those related to a resist mask.

Further, the W layer 44 is formed by a sputtering process. Therefore, compared with the first and second conventional methods described previously in which a polysilicon mask is used, a contact hole is able to be formed at decreased process temperatures.

As a result, this method is applicable to the future ULSIs with a minimum feature size of a quarter (¼) μm.

It is needless to say that this method may be applied to the formation of a through hole.

SECOND EMBODIMENT

FIGS. 4A to 4F show a formation method of a contact hole according to a second embodiment.

Figure 4A:
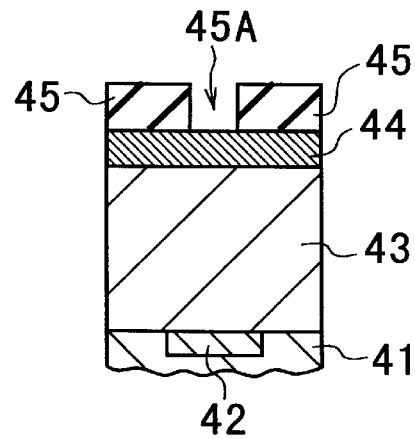
FIGS. 4A to 4F are partial cross-sectional views showing a formation method of a contact hole according to a second embodiment of the present invention, respectively.
Figure 4B:
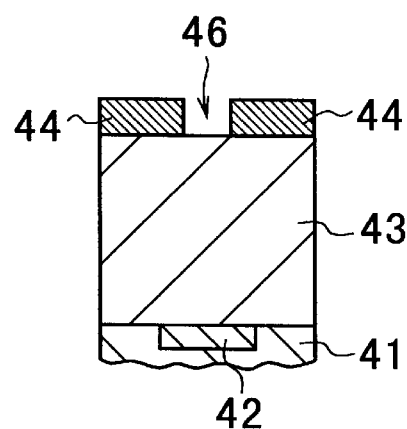
Figure 4C:
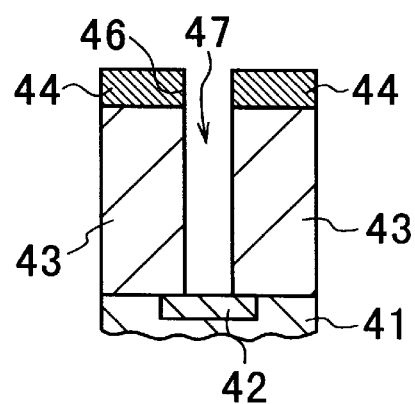

The process steps shown in FIGS. 4A to 4C are the same as those in the first embodiment shown in FIGS. 3A to 3C. Therefore, the explanation about these steps is omitted here by adding the same reference numerals to the corresponding elements in FIGS. 4A to 4C for the sake of simplification.

In the method according to the second embodiment, unlike the first embodiment, the patterned W layer 44 is not removed from the $SiO_2$ layer 43.

Figure 4D:
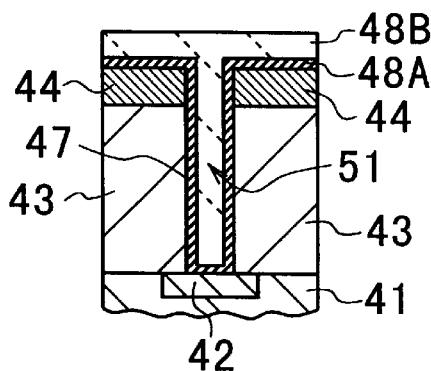

Following the process step of FIG. 4C, a Ti layer 48A with a thickness of 30 nm and a TiN layer 48B with a thickness of 100 nm are successively deposited on the W layer 44 by CVD processes to cover the hole pattern 46 of the W layer 44 and the contact hole 47 of the $SiO_2$ layer 43, as shown in FIG. 4D. The holes 46 and 47 are filled with the Ti and TiN layers 48A and 48B. The lower Ti layer 48A serves as a contact layer improving the adhesion property of the upper TiN layer 48B to the $SiO_2$ layer 43 and the W layer 44. The upper TiN layer serves as an additional conductive layer in the upper electrical conductor 70 and as the main conductive layer for the electrically conductive plug 51.

As seen from FIG. 4D, within the holes 46 and 47, the lower Ti layer 48A is contacted with not only the inner side faces of the $SiO_2$ layer 43 and the W layer 44 but also the n-type impurity-doped region 42 in the substrate 41. The hole pattern 46 of the W layer 44 serves as a contact hole connecting with the contact hole 47 of the $SiO_2$ layer 43.

Figure 4E:
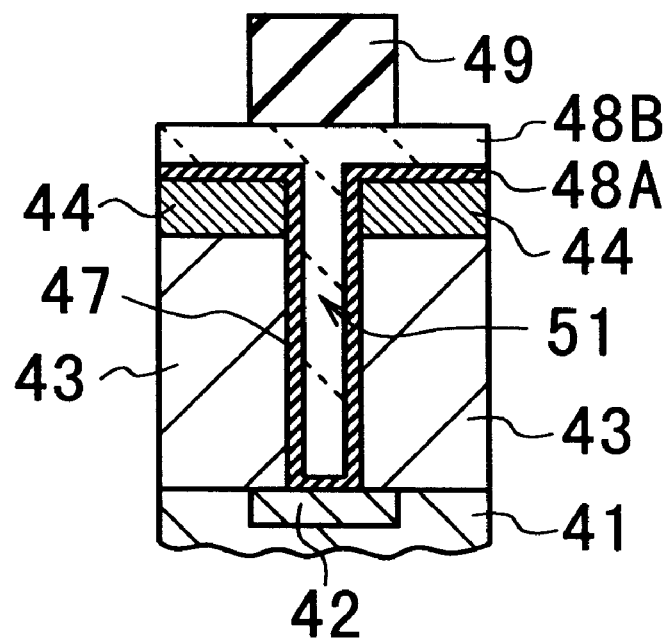

Subsequently, a patterned EB resist film 49 is formed on the TiN layer 48B, as shown in FIG. 4E. The resist film 49 has a pattern with a width of 240 nm, which corresponds to an upper electrical conductor 70.

Figure 4F:
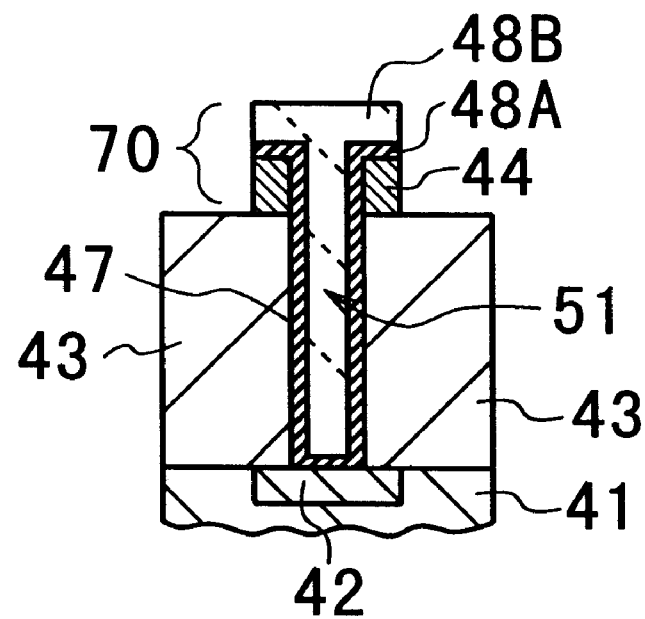

Using the patterned EB resist film 49 as a mask, the underlying Ti and TiN layers 48A and 48B are selectively etched by an RIE process. Subsequently, the underlying W layer 44 is selectively etched by another RIE process using the patterned ES resist film 49 as a mask. Thus, the three layers 48A, 48B and 44 are selectively left in the area surrounding the upper opening end of the hole pattern 46, as shown in FIG. 4F. This area corresponds to the resist film 49.

The upper parts of the remaining Ti and TiN layers 48A and 48B and the remaining W layer 44 serve as the upper electrical conductor 70. The lower parts of the remaining Ti and TiN layers 48A and 48B in the contact hole 47 serve as an electrically conductive plug 51. The upper electrical conductor 70 is electrically interconnected with the n-type impurity-doped region 42 in the substrate 41 through the metal plug 51.

It is clear that the formation method of a contact hole according to the second embodiment has the same advantages as those in the first embodiment. There is an additional advantage that the upper conductor 70 is lower in electric resistance than the upper conductor 50.

It is needless to say that this method nay be applied to the formation of a through hole.

THIRD EMBODIMENT

FIGS. 5A to 5I show a formation method of a contact hole according to a third embodiment.

Figure 5A:
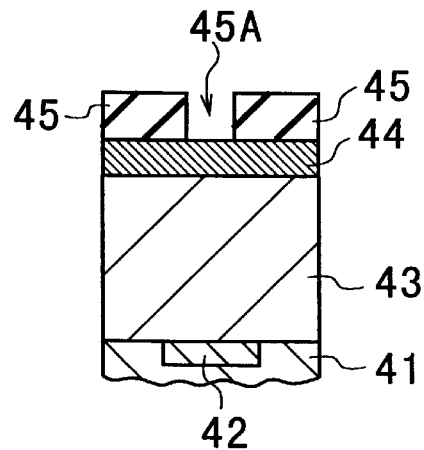

First, as shown in FIG. 5A, an n-type impurity such as As or P is selectively diffused into the surface region of a p-type single-crystal silicon substrate 41, forming an n-type impurity-doped region 42 in the substrate 41. This n-type impurity-doped region 42 serves as a lower electrical conductor.

Second, an $SiO_2$ layer 43 with a thickness of 1 μm is deposited on the substrate 41 to cover the n-type impurity-doped region 42 by a CVD process. This $SiO_2$ layer 43 serves as an interlayer dielectric layer.

A first tungsten (W) layer 44 with a thickness of 100 nm is deposited on the $SiO_2$ layer 43 by a sputtering process. This W layer 44 is contacted with the $SiO_2$ layer 43 with no intervening layer such as a well-known, two-layered structure formed by an upper titanium nitride (TiN) layer and a lower titanium (Ti) layer.

Following the sputtering process of the first W layer 44, a patterned EB resist film 45 with a thickness of 500 nm is formed on the W layer 44 thus deposited by an EB lithography technique. This resist film 45 has a window or a hole pattern 45A with a rectangular plan shape of 240 nm in width. The width is larger than that in the first embodiment. The state at this stage is shown in FIG. 5A.

Figure 5B:
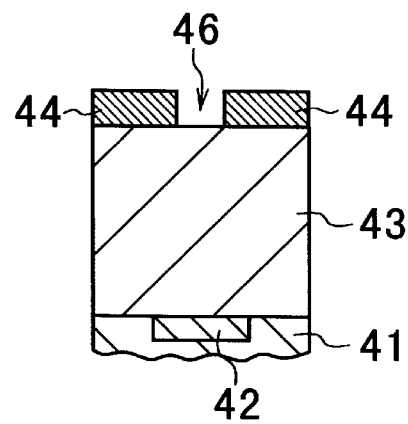

Subsequently, using the patterned EB resist film 45 as a mask, the first W layer 44 is selectively etched by an RIE process, forming a penetrating hole 46 in the W layer 44, as shown in FIG. 5B. Thus, the hole pattern 45A of the resist film 45 is transferred to the first W layer 44. The $SiO_2$ layer 43 is exposed from the first W layer 44 in the hole 46. The EB resist film 45 is then removed by using oxygen ($O_2$) plasma or another popular process.

Figure 5C:
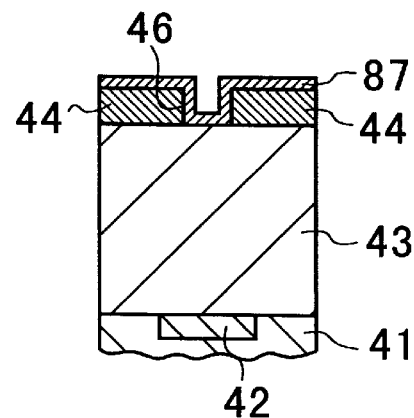

Prior to the etching process of the $SiO_2$ layer 43, a second W layer 87 with a thickness of 30 nm, which is thinner than the first W layer 44, is deposited on the first W layer 44 by a CVD process, as shown in FIG. 5C. The second W layer 87 is contacted with the top of the $SiO_2$ layer 43 and the side face of the first W layer 44 in the hole 46.

Figure 5D:
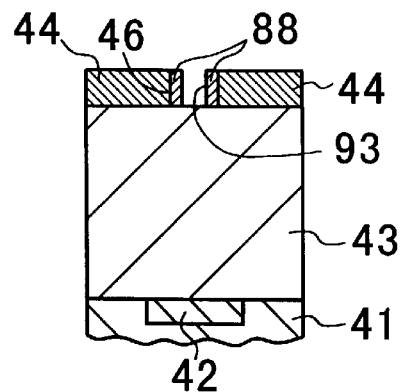

The second W layer 87 is then etched by an isotropic etching process to be left on the side face of the first W layer 44, resulting in a sidewall 88 in the hole 46, as shown in FIG. 5D. The sidewall 88 is formed by the remaining second W layer 87. The sidewall 88 narrows the hole. pattern 46 by twice the thickness of the sidewall 88 (i.e., 30 nm×2=60 nm) to form a hole pattern 93 with a width of 180 nm. The combination of the first W layer 44 and the W sidewall 88 is used as a hard mask in the next RIE process for the $SiO_2$ layer 43.

Figure 5E:
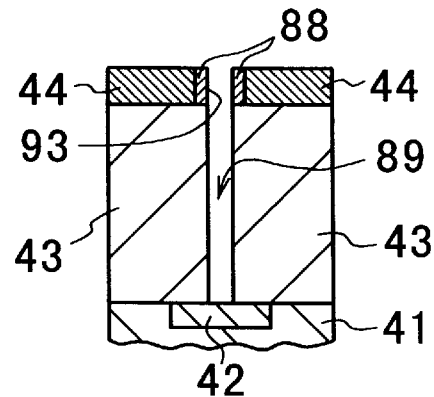

The $SiO_2$ layer 43 is selectively etched by an RIE process using the combination of the first W layer 44 and the W sidewall 87 as a hard mask, forming a contact hole 89 penetrating the $SiO_2$ layer 43, a s shown in FIG. 5E. The contact hole 89, which is narrower in width than the contact hole 47 in the first embodiment, is located just over the n-type impurity-doped region 42. The region 42 is exposed from the $SiO_2$ layer 43 through the contact hole 89.

Figure 5F:
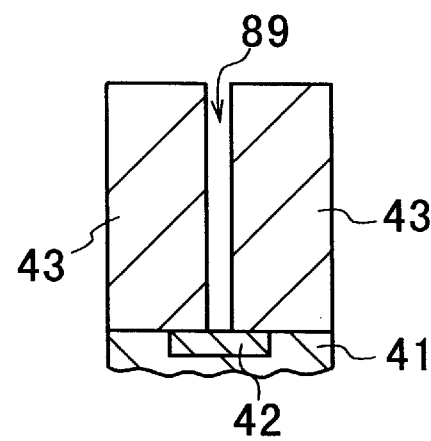

The first W layer 44 and the W sidewall 88, which have been used as the hard mask, are removed from the $SiO_2$ layer 43 by dipping the layer 44 and the sidewall 88 into $H_2O_2$ at room temperature for two minutes. The state at this stage is shown in FIG. 5F.

Figure 5G:
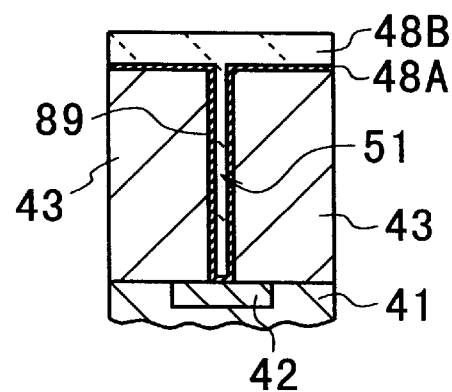

A Ti layer 48A with a thickness of 30 nm and a TiN layer 48B with a thickness of 100 nm are successively deposited on the $SiO_2$ layer 43 by CVD processes to cover the contact hole 89, as shown in FIG. 5G. The hole 89 is filled with the Ti and TiN layers 48A and 48B.

As seen from FIG. 5G, within the contact hole 89, the lower Ti layer 48A is contacted with not only the inner side face of the SiO₂ layer 43 but also the n-type impurity-doped region 42 in the substrate 41.

Figure 5H:
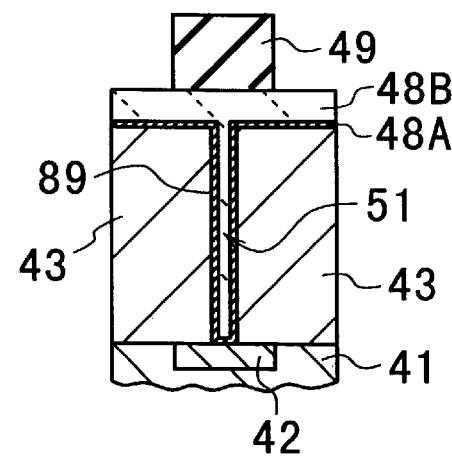
Figure 51:
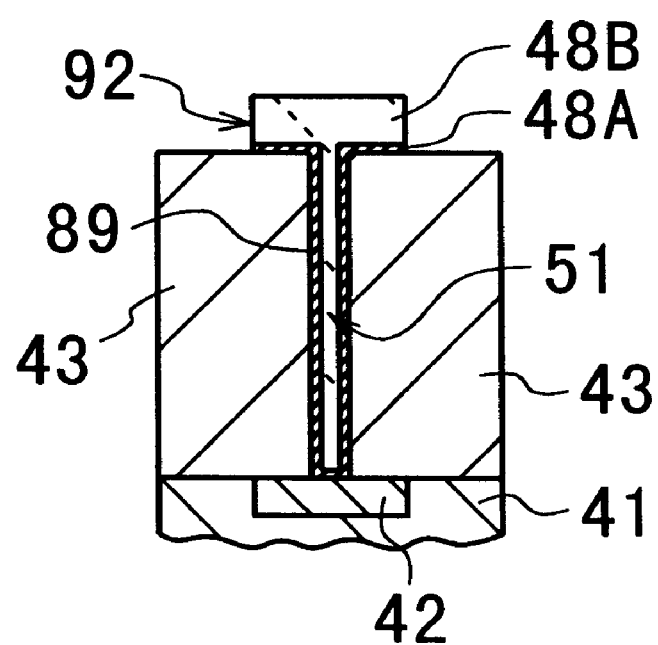

Subsequently, a patterned EB resist film 49 is formed on the TiN layer 48B, as shown in FIG. 5H. The resist film 49 has a pattern corresponding to an upper conductor 92.

Using the patterned EB resist film 49 as a mask, the underlying Ti and TiN layers 48A and 48B are selectively etched by an RIE process, as shown in FIG. 5I. Thus, the layers 48A and 48B are selectively left in the area surrounding the upper opening end of the contact hole 89. This area corresponds to the resist film 49. The upper parts of the remaining Ti and TiN layers 48A and 48B serve as an upper electrical conductor 50. The lower parts of the remaining Ti and TiN layers 48A and 48B in the contact hole 89 serve as an electrically-conductive plug 51. The upper electrical conductor 92 is electrically interconnected with the n-type impurity-doped region 42 in the substrate 41 through the metal plug 51.

With the formation method of a contact/through hole according to the third embodiment, due to the same reason as that of the first embodiment, the same advantage as those in the first embodiment are obtained. There is an additional advantage that the narrowed contact hole 89 is realized compared with the first embodiment.

It is needless to say that this method may be applied to the formation of a through hole.

FOURTH EMBODIMENT

FIGS. 6A to 6H show a formation method of a contact hole according to a fourth embodiment.

The process steps shown in FIGS. 6A to 6E are the same as those in the third embodiment shown in FIGS. 5A to 5E. Therefore, the explanation about these steps is omitted here by adding the same reference numerals to the corresponding elements in FIGS. 6A to 6E for the sake of simplification.

In the method according to the fourth embodiment, unlike the third embodiment, the first W layer 44 and the W sidewall 88 are not removed from the SiO₂ layer 43.

Figure 6A:
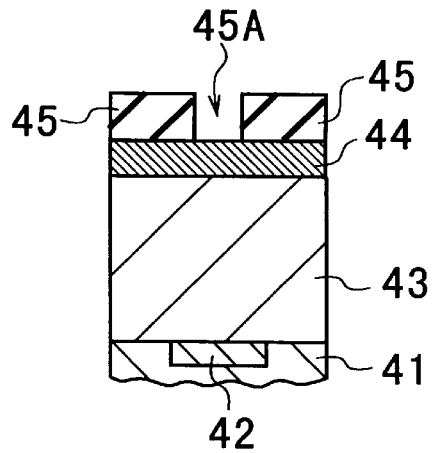
FIGS. 6A to 6H are partial cross-sectional views showing a formation method of a contact hole according to a fourth embodiment of the present invention, respectively.
Figure 6B:
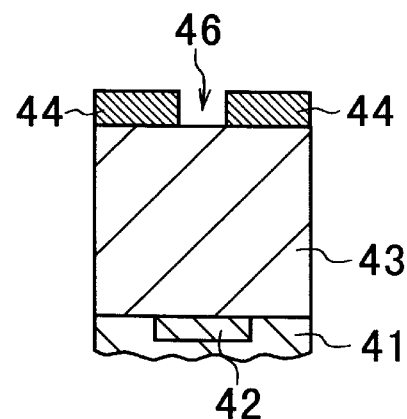
Figure 6C:
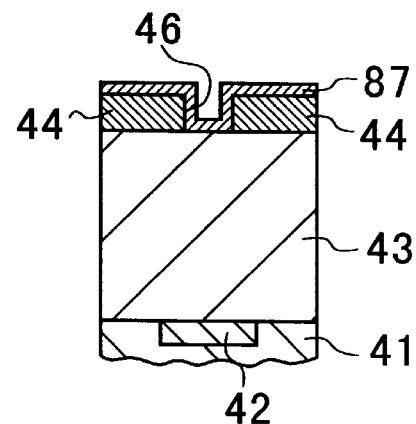
Figure 6D:
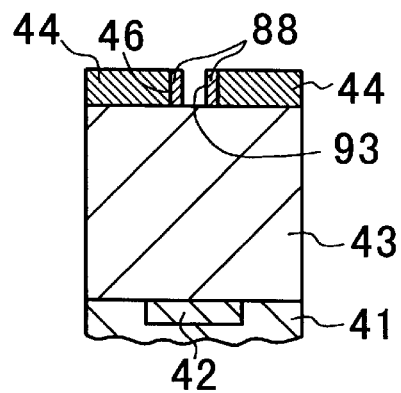
Figure 6E:
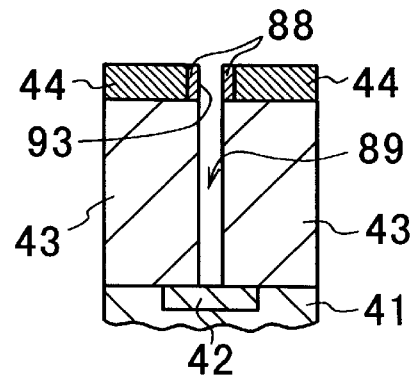
Figure 6F:
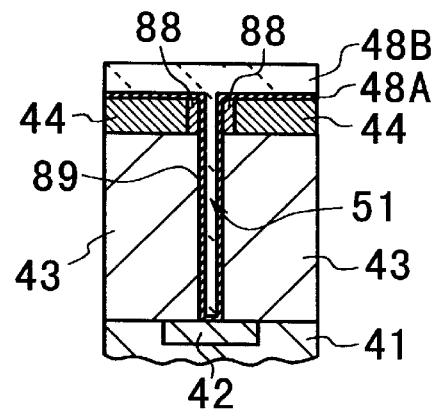

Following the process step of FIG. 6E, a Ti layer 48A with a thickness of 30 nm and a TiN layer 48B with a thickness of 100 nm are successively deposited on the first W layer 44 by CVD processes to cover the hole pattern 93 of the first W layer 44 and the contact hole 89 of the SiO₂ layer 43, as shown in FIG. 6F. The holes 46 and 47 are filled with the Ti and TiN layers 48A and 48B.

As seen from FIG. 6F, within the holes 46 and 47, the lower Ti layer 48A is contacted with not only the inner side faces of the SiO₂ layer 43 and the first W layer 44 but also the n-type impurity-doped region 42 in the substrate 41. The hole pattern 93 of the first W layer 44 serves as a contact hole connecting with the contact hole 89 of the SiO₂ layer 43.

Figure 6G:
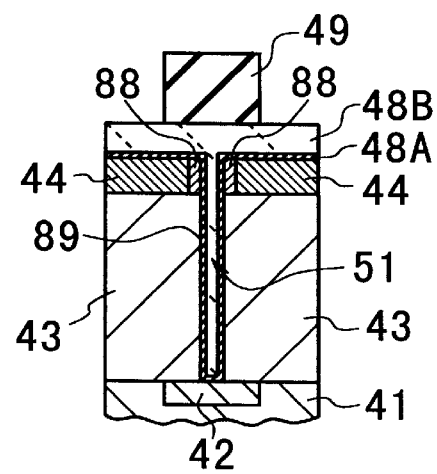

Subsequently, a patterned EB resist film 49 with a width of 240 nm is formed on the TiN layer 48B, as shown in FIG. 6G. The resist film 49 has a pattern corresponding to an upper conductor 112.

Figure 6H:
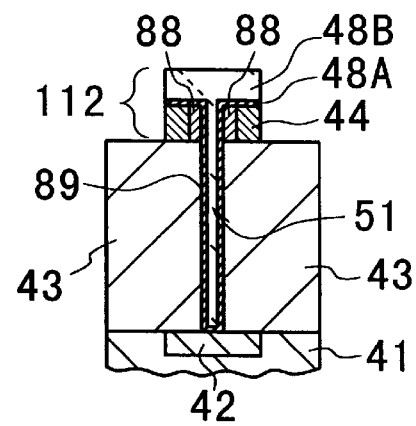

Using the patterned EB resist film 49 as a mask, the underlying Ti and TiN layers 48A and 48B are selectively etched by an RIE process. Subsequently, the underlying first W layer 44 is selectively etched by another RIE process using the EB resist film 49 as a mask. Thus, the three layers 48A, 48B, and 44 are selectively left in the area surrounding the upper opening end of the hole pattern 46, as shown in FIG. 6H. This area corresponds to the resist film 49.

The upper parts of the remaining Ti and TiN layers 48A and 48B and the remaining W layer 44 serve as the upper electrical conductor 112. The lower parts of the remaining Ti and TiN layers 48A and 48B in the contact hole 89 serve as an electrically conductive plug 51. The upper electrical conductor 112 is electrically interconnected with the n-type impurity-doped region 42 in the substrate 41 through the metal plug 51.

It is clear that the formation method of a contact hole according to the fourth embodiment has the same advantages as those in the first embodiment. There is an additional advantage that the upper conductor 12 is lower in electric resistance than the upper conductor 70 in the second embodiment.

It is needless to say that this method may be applied to the formation of a through hole.

TESTS

The following fact was known through the inventor's tests.

Even a polysilicon layer doped in situ with phosphorus (P) has a specific electric !resistance of approximately 600 $\mu\Omega$·cm, which is comparable to the specific resistance of approximately 150 $\mu\Omega$·cm of a sputtered TiN layer, of approximately 75 $\mu\Omega$·cm of a sputtered Ti layer, and of approximately 14 $\mu\Omega$·cm of a sputtered W layer.

Further, the following data (1) to (6) about the sheet resistance $R_S$ were obtained.
(1) A single PVD-W layer (thickness: 100 nm)
   $R_S$=1.43 $\Omega/\square$
(2) A single PVD-W layer (thickness: 200 nm):
   $R_S$=0.70 $\Omega/\square$.
(3) A single PVD-TiN layer (thickness: 100 nm):
   $R_S$=10.77 $\Omega/\square$.
(4) A single PVD-TiN layer (thickness: 200 nm):
   $R_S$=5.53 $\Omega/\square$.
(5) The combination of an upper PVD-W layer (thickness: 100 nm) and a lower PVD-TiN layer (thickness: 100 nm):
   $R_S$=2.23 $\Omega/\square$.
(6) The combination of an upper PVD-TiN layer (thickness: 100 nm) and a lower PVD-W layer (thickness: 100 nm):
   $R_S$=0.96 $\Omega/\square$.

Supposing that a CVD-TiN layer has a same electric resistance as that of a PVD-TiN, it was known that the lowest sheet resistance $R_S$ of 0.96 $\Omega/\square$ was obtained in the case (6), which corresponds to the above second and fourth embodiments. If the total thickness of 200 nm in the case (6) is excessively large, the lower PVD-W layer may be removed prior to the deposition of the CVD-TiN layer. However, in this case (3), the obtainable sheet resistance $R_S$ was increased up to 10.77 $\Omega/\square$.

In the case (5), the sheet resistance $R_S$ was decreased to only 2.23 $\Omega/\square$. If the PVD-TiN layer was etched away prior to the deposition of the CVD-W-layer (i.e., in the case (1) or (2)), the obtainable sheet resistance $R_S$ was 1.43 or 0.70 $\Omega/\square$. However, in the case (1) or (2), there was a disadvantage that the number and the complicacy of the necessary process steps became large, resulting in a higher formation cost of a contact hole.

Supposing that a CVD-W layer has a same electric resistance as that of a PVD-W, the lowest sheet resistance $R_S$ of 1.43 $\Omega/\square$ was obtained in the case (1), which corresponds to the above first and third embodiments. In this case (1), a PVD-W layer may be used instead of the two-layer structure of the TiN barrier layer and the Ti contact layer, which has been popularly used for a CVD-W layer. Accordingly, it was known that the lowest sheet resistance was realized with the use of a single PVD- or CVD-W layer.

VARIATIONS

In the above third and fourth embodiments, the first W layer 44 (and the W sidewall 88) is (are) selectively removed by a wet etching process using $H_2O_2$ while protecting the impurity-doped region 42 in the substrate 41 and the $SiO_2$ layer 43. However, the present invention is not limited to these cases. The selective removal of the first W layer 44 (and the W sidewall 88) may be successfully accomplished by suitably changing the wet or dry etching chemistry according to the sort of the hard mask layer.

If a satisfactory etch selectivity is not accomplished by an RIE process, a suitable wet-etching process may be used.

For example, for a Ti hard mask, an etchant mainly containing $NH_4OH$ has a satisfactory etch selectivity to Si, $SiO_2$, and TiN at a temperature of 20 to 40° C. In other words, this $NH_4OH$-system etchant etches the Ti hard mask away while affecting no bad effects to the underlying materials. Therefore, the Ti hard mask may be used for etching a contact hole with respect to a silicon substrate and for etching a through hole with respect to a TiN-covered electrical conductor or TiN electrical conductor.

For a TiN hard mask, an etchant mainly containing $H_2SO_4$ has a satisfactory etch selectivity to Si, $SiO_2$, and W at a temperature of 20 to 40° C. In other words, this $H_2SO_4$-system etchant etches the TiN hard mask away while affecting no bad effects to the underlying materials. Therefore, The TiN hard mask may be used for etching a through hole with respect to a W-covered electrical conductor or W electrical conductor.

For a W hard mask, an etchant mainly containing $H_2O_2$ has a satisfactory etch selectivity to Si, $SiO_2$, Ti, and TiN at a temperature of 20 to 40° C. In other words, this $H_2O_2$-system etchant etches the W hard mask away while affecting no bad effects to the underlying materials. Therefore, The W hard mask may be used for etching a through hole with respect to a Ti-covered TiN electrical conductor or TiN-covered Ti electrical conductor.

Although the formation methods of a contact hole are explained in the above first to fourth embodiments, the present invention is not limited thereto. The p-type silicon substrate 41 may be of an n-type, and the n-type impurity-doped region 42 may be of a p-type. Further, although a W hard mask is used together with a TiN/Ti plug in the first to fourth embodiments, a Ti hard mask may be used together with a W plug.

Additionally, in the case of forming a through hole, the impurity-doped region 42 is replaced with a electrical conductor located below the dielectric layer 43.

Although an RIE process is used in the first to fourth embodiments, the present invention is not limited thereto. It is needless to say that any other etching process may be used.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A formation method of a contact/through hole comprising the steps of:
    (a) forming a dielectric layer on a semiconductor substructure having a lower electrical conductor;
    (b) forming a metal layer on said dielectric layer by physical vapor deposition;
    (c) forming a patterned resist film on said metal layer; said resist film having a pattern for a contact/through hole;
    (d) selectively dry-etching said metal layer using said patterned resist film as a mask to thereby transfer the pattern of said resist film to said metal layer, forming a hole pattern to penetrate said metal layer;
    (e) removing said patterned resist film from said etched metal layer; and
    (f) selectively etching said dielectric layer using said etched metal layer as a mask to thereby transfer the hole pattern of said metal layer to said dielectric layer, forming a contact/through hole to penetrate said dielectric layer and to extend to said lower electrical conductor such that electrical contact may be made to said lower electrical conductor through said contact/through hole;
    wherein said metal layer serves as a mask having a high etch selectivity with respect to said dielectric layer during the etching step (f);
    and wherein said contact/through hole is completed while said metal layer is subject to negligible thickness reduction with respect to its initial thickness due to an etching action during the etching step (f).

2. A method as claimed in claim 1, further comprising the steps of:
    (g) removing said metal layer after the step (f); and
    (h) forming an electrically-conductive plug to fill said hole of said dielectric layer;
    wherein said lower electrical conductor in said substructure is electrically connected to an upper electrical conductor formed on said dielectric layer through said plug.

3. A method as claimed in claim 2, the step (g) of removing said metal layer is performed by a wet etching process using an etchant having a selectivity with respect to said dielectric layer and said exposed substructure.

4. A method as claimed in claim 1, further comprising a step of:
    (g) forming an electrically-conductive plug to fill said hole of said dielectric layer without removing said metal layer;
    wherein said lower electrical conductor in said substructure is electrically connected to an upper electrical conductor formed on said dielectric layer through said plug;
    and wherein a remaining metal layer serves as a part of said upper electrical conductor.

5. A formation method of a contact/through hole comprising the steps of:
    (a) forming a dielectric layer on a semiconductor substructure having a lower electrically-conductive region or layer;
    (b) forming a first metal layer on said dielectric layer by physical vapor deposition;
    (c) forming a patterned resist film on said first metal layer; said resist film having a pattern for a contact/through hole;
    (d) selectively etching said first metal layer using said patterned resist film as a mask to thereby transfer the pattern of said resist film to said first metal layer, forming a hole pattern to penetrate said first metal layer;
    (e) removing said patterned resist film from said etched, first metal layer;
    (f) forming a second metal layer on said etched, first metal layer;
    said second metal layer being contacted with said dielectric layer in said hole pattern of said first metal layer;

(g) selectively etching said second metal layer by an anisotropic etching process, forming a metal sidewall by said second metal layer remaining in the hole pattern of said first metal layer; and (h) selectively etching said dielectric layer using said etched first metal layer and said metal sidewall as a mask to thereby transfer the hole pattern of said metal sidewall to said dielectric layer, forming a contact/through hole to penetrate said dielectric layer and to extend to said lower electrically-conductive region or layer;

wherein said first metal layer and said metal sidewall have approximately the same height above said dielectric layer and serve as a mask having a high etch selectivity with respect to said dielectric layer during the etching step (h);

and wherein said contact/through hole is completed while said first metal layer and said metal sidewall are subject to negligible thickness reduction with respect to their initial thickness due to an etching action during the etching step (h).

6. A method as claimed in claim 5, further comprising the steps of:

(i) removing said metal layer and said metal sidewall after the step (h); and (j) forming an electrically-conductive plug to fill said hole of said dielectric layer;

wherein said lower electrical conductor in said substructure is electrically connected to an upper electrical conductor formed on said dielectric layer through said plug.

7. A method as claimed in claim 6, the step (i) of removing said first metal layer is performed by a wet etching process using an etchant having a selectivity with respect to said dielectric layer and said exposed substructure.

8. A method as claimed in claim 5, further comprising a step of:

(k) forming an electrically-conductive plug to fill said hole of said dielectric layer without removing said first metal layer;

wherein said lower electrical conductor in said substructure is electrically connected to an upper electrical conductor formed on said dielectric layer through said plug;

and wherein the first metal layer remaining serves as a part of said upper electrical conductor.

* * * * *